United States Patent [19]

Bletz

[11] 4,218,613
[45] Aug. 19, 1980

[54] AMPLIFIER FOR ELECTRIC SIGNALS

[75] Inventor: Walter Bletz, Braunfels, Fed. Rep. of Germany

[73] Assignee: Ernst Leitz Wetzlar GmbH, Wetzlar, Fed. Rep. of Germany

[21] Appl. No.: 954,837

[22] Filed: Oct. 26, 1978

[30] Foreign Application Priority Data

Oct. 29, 1977 [DE] Fed. Rep. of Germany ....... 2748647

[51] Int. Cl.² ............................................ H01J 39/12
[52] U.S. Cl. ................................ 250/214 A; 307/311; 330/59; 330/110
[58] Field of Search .................. 307/311; 330/59, 103, 330/110; 250/214 A

[56] References Cited

U.S. PATENT DOCUMENTS

| 3,992,622 | 11/1976 | Numata et al. | 307/311 X |
| 3,999,060 | 12/1976 | Skagerlund | 330/110 X |
| 4,096,382 | 6/1978 | Numata et al. | 307/311 X |

Primary Examiner—James B. Mullins
Attorney, Agent, or Firm—Schwartz, Jeffery, Schwaab, Mack, Blumenthal & Koch

[57] ABSTRACT

Disclosed is an amplifier for electrical signals obtained by means of a photoelectric transducer as a function of the intensity of illumination incident upon said transducer, comprising an operational amplifier adapted to be connected in series after the photoelectric transducer and having a feedback branch, wherein the feedback branch of the operational amplifier includes an electrical element having a nonlinear characteristic connected in parallel with a resistance.

10 Claims, 8 Drawing Figures

AMPLIFIER FOR ELECTRIC SIGNALS

BACKGROUND OF THE INVENTION

The invention concerns an amplifier for electric signals obtained by means of a photoelectric transducer. The amplifier contains an operational amplifier in series with the photoelectric transducer and operates as a function of the intensity of illumination acting on the transducer. Amplifiers of this type are employed particularly in exposure measurements in connection with photographic cameras.

The illumination intensity on the photoelectric transducer may vary by several orders of magnitude in its absolute level. In an analogy to acoustics, it is possible to speak in terms of a large dynamic range or large dynamics. In photography, for example, in the case of an exposure meter, a brightness range of 4-5 orders of magnitude is employed. This range of brightness is related to the level of steady light. With other optical instruments, e.g., range finders, an alternating light signal is of interest; this may be superposed upon the steady light signal and may be significantly smaller in its amplitude, measured for example as the peak-to-peak value in the case of a sinusoidal signal, than the steady light signal.

The photoelectric transducers, which convert light into electric current, in accordance with the present state of the art, consist almost exclusively of semiconductor photodiodes. The currents supplied by these receivers are proportional over more than eight orders of magnitude to the light incident upon them, when operated in a conducting state, i.e., when the voltage on them is kept very small. The latter condition is readily satisfied with operational amplifiers which perform current-voltage transformation.

However, within the voltage range only about four orders of magnitude may be processed, because the output voltage of the operational amplifiers is limited upwardly by the supply voltage. Downwardly, small voltages are submerged in noise; this is a characteristic of all operational amplifiers. In a known amplifier circuit, voltage proportional to the incident light on the photoelectric transducer may be taken off at the output of said circuit, but only with a dynamic range of about four orders of magnitude. In cases where only the alternating signal is of interest and the latter is smaller by a factor of 100 than the steady light signal, the result is that only a dynamic range of two orders of magnitude is available.

Considering further that, as is known, the feedback resistance present in the feedback branch of the operational amplifier must be as high as possible for purposes of noise optimization (e.g., 1 GOhm), it may be readily seen that only a very narrow dynamic range remains. Otherwise, the amplifier is not optimum with respect to noise.

It is also known to provide in the feedback branch of an operational amplifier an element with a nonlinear, e.g., exponential, characteristic. The latter results in the voltage at the output of the amplifier becoming a logarithmic measure of the light incident upon the photoelectric transducer. The disadvantage of this form of design resides in the fact that the upper angular frequency of the transfer range varies with the level of steady light. In the case of low illumination intensities, the signal frequencies of interest are thus uncontrollably cut. In addition, the alternating voltage at the output of the amplifier is fundamentally distorted because of the exponential characteristics. This is particularly apparent with high amplitudes.

SUMMARY OF THE INVENTION

It is therefore an object of the present invention to provide an improved amplifier.

A particular object of the invention resides in the provision of an amplifier having optimum noise control, a wide dynamic range and which in its transfer behavior is independent of the steady light level or dependent on the latter in a controllable manner.

In accomplishing the foregoing objects, there has been provided according to the present invention an amplifier for electrical signals obtained by means of a photoelectric transducer as a function of the intensity of illumination incident upon said transducer, comprising an operational amplifier adapted to be connected in series after the photoelectric transducer and having a feedback branch, wherein the feedback branch of the operational amplifier includes an electrical element having a nonlinear characteristic connected in parallel with a resistance.

As a specific embodiment, the invention provides for the use of a diode as the element with the exponential characteristic. However, in another embodiment a transistor may be employed in place of the diode, said transistor having its base at zero potential.

According to another embodiment, first electrical elements are included in the feedback branch of the operational amplifier, by means of which the alternating signal components are fed back negatively, and further, second electrical structural elements are included, by means of which the direct signal component is negatively fed back separately from the alternating signal components.

In this second embodiment, as a first specific variation, a circuit is provided, in which the first electrical structural elements comprise a resistance, while the second electrical structural elements comprise an RC member and a nonlinear resistance, the resistivity of said resistance declining with increasing voltages.

This nonlinear resistance may be a transistor with an exponential characteristic. Further, this resistance may be a MOS field effect transistor of the enhancement type, in which the gate and the drain are connected with each other.

In a further embodiment of the invention, the first electrical elements may also comprise a nonlinear resistance, which, for example, may be a varistor. In particular, however, it is proposed to use at this point in the circuit a MOS field effect transistor of the p-channel enhancement type as the nonlinear resistance, in which the gate and the drain are connected with each other.

BRIEF SUMMARY OF THE DRAWINGS

In the drawing, the invention is represented by several embodiments, as follows.

DETAILED DESCRIPTION OF PREFERRED EMBODIMENTS

In FIGS. 1–5, the operational amplifier is always designated by V, with the feedback branch of said amplifier in each case containing an ohmic resistance $R_p$.

Figure 1:
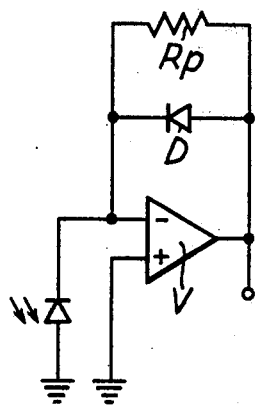
FIG. 1 is a circuit diagram of a first variation of the first embodiment according to the invention.

In the embodiment of FIG. 1, a diode D is connected in parallel with the resistance $R_p$. The diode has an exponential characteristic. In this way, the resistance $R_p$ holds the upper angular frequency below a predetermined point. This embodiment has the disadvantage that the resistance $R_p$ may assume only a value determined by the capacity of the diode D.

Figure 2:
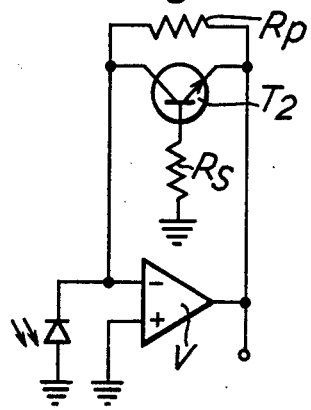
FIG. 2 is a circuit diagram of a second variation of the first embodiment.

Another embodiment is therefore proposed in FIG. 2. The transistor $T_2$ acts here as the element having an exponential characteristic. With respect to the upper angular frequency of the transfer characteristic, here in addition to $R_p$, only the collector-emitter capacity of the transistors is effective, wherein said capacity may be made more or less effective by means of the resistance $R_s$, in order to prevent overshooting. The disadvantage here consists of the fact that the transistor must be a HF transistor with a low capacity.

Figure 3:
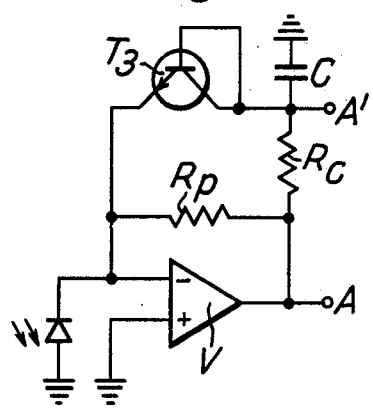
FIG. 3 is a circuit diagram of a first variation of the second embodiment according to the invention.

Another embodiment according to FIG. 3 is further proposed. In this embodiment, the direct and alternating current signals are separately connected in a negative feedback circuit. Specifically the alternating current signal is negatively fed back by means of $R_p$ and the direct current signal by means of the transistor $T_3$. The transistor $T_3$ is connected as a logarithmic diode. The associated direct voltage is formed by means of a filter section C, $R_C$. The alternating current signal may be taken off at the output A and the logarithmic direct current signal at the output A'.

In order to obtain favorable noise properties, the transistor $T_3$ must be as highly ohmic at low illumination intensities as possible. In the case of conventional transistors this is true to a limited extent only.

Figure 4:
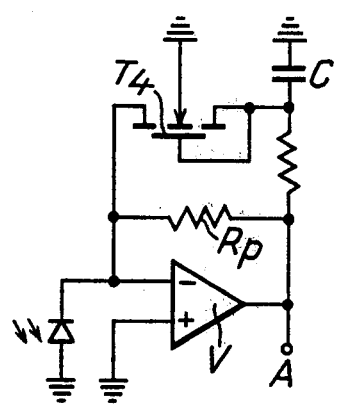
FIG. 4 is a circuit diagram of a second variation of the second embodiment.

For this reason, still another circuit, according to FIG. 4, is proposed, in which in place of a transistor an n-channel enhancement MOS field effect transistor $T_4$ is used. The alternating signal may be taken off at the output A. The direct current signal is negatively fed back by way of the transistor $T_4$, which becomes conducting when the gate threshold voltage is attained. An example of such a transistor is the CD 4007 arrangement of the RCA Company.

In the circuits according to FIGS. 1 and 2 no overloading is possible, either by the direct or the alternating signal, and therefore the amplifier with its output voltage cannot go to its upper or lower end even for short periods of time. On the other hand, in the circuits according to FIGS. 3 and 4 protection is provided against overloading by the direct current signal only. It may be desirable, however, for various reasons to prevent overloading by the alternating signal also.

Figure 5:
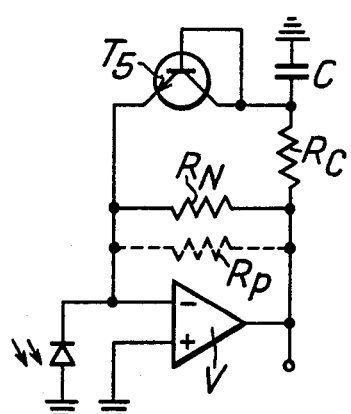
FIG. 5 is another circuit diagram of an amplifier corresponding to the second embodiment.
Figure 6:
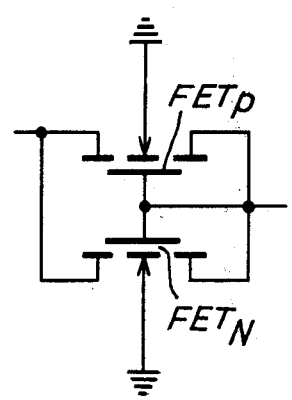
FIG. 6 is a diagram of two MOS field effect transistors of the p-channel enhancement type and the n-channel enhancement type, respectively, connected in parallel.

It is therefore proposed as a final embodiment, shown in FIG. 5, to employ a nonlinear resistance $R_N$ in the negative alternating signal feedback or to connect such in parallel with the resistance $R_P$ for the negative feedback of the alternating signal. A varistor may be used as the resistance $R_N$. However, a MOS field effect transistor pair having a higher threshold voltage than transistor $T_5$, may also be used. Such a transistor pair is shown diagrammatically in FIG. 6.

Figure 7A:
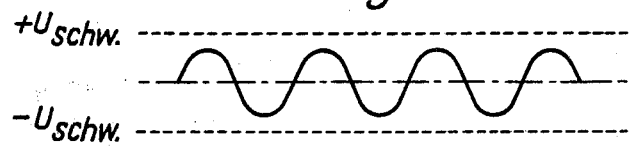
FIG. 7a, 7b is an explanation of the signal pattern in the MOS field effect transistors connected in parallel, according to FIG. 6.
Figure 7B:
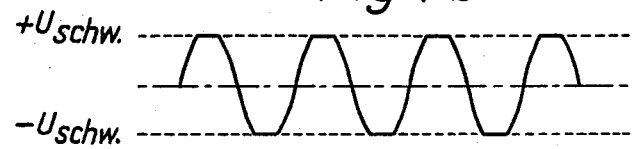

As long as the alternating current amplitude remains below the threshold voltage $U_{Schw}$ of the MOS field effect transistor (FIG. 7a), only the resistance $R_P$ is effective as the negative feedback for the alternating signal. Beyond this, the n channel and the p channel types, respectively, become alternatingly conductive at positive and negative amplitudes and the alternating voltage is thus distorted (FIG. 7b); however, a well defined alternating signal negative feedback is always assured.

What is claimed is:

1. An amplifier circuit for electrical signals having A.C. signal components and D.C. signal components produced by means of a photoelectric transducer as a function of intensity of illumination incident upon said transducer, comprising:

an operational amplifier operatively connected in series after said photoelectric transducer and having a feedback branch, said feedback branch including a resistance connected in parallel with an electrical element having a current-nonlinear characteristic, whereby the amplifier circuit has a frequency band with an upper angular frequency which is determined by said resistance and by the capacity of said current-nonlinear electrical element for low light illumination intensities incident upon said transducer.

2. An amplifier circuit according to claim 1, wherein said electrical element having a current-nonlinear characteristic comprises a diode having an exponential characteristic.

3. An amplifier circuit according to claim 1, wherein said electrical element having a current-nonlinear characteristic comprises a transistor having an exponential characteristic and having a base connected to zero potential.

4. An amplifier circuit for electrical signals having A.C. signal components and D.C. signal components produced by means of a photoelectric transducer as a function of intensity of illumination incident upon said transducer, comprising:

an operational amplifier operatively connected in series after said photoelectric transducer;

electrical circuit means operatively connected after said operational amplifier for separating and providing at respective first and second outputs said A.C. signal components and said D.C. signal components; and a feedback branch comprising first electrical elements operatively connected for negatively feeding back said A.C. signal components from said first output to an input of said operational amplifier, and second electrical elements operatively connected for negatively feeding back said D.C. signal components from said second output to said input of said operational amplifier.

5. An amplifier circuit according to claim 4, wherein said first electrical elements comprise an ohmic resistance, said second electrical elements comprise a current-nonlinear resistance having a resistivity which decreases with rising voltages, and said electrical means for separating said A.C. signal components and said D.C. signal components comprise an RC member.

6. An amplifier circuit according to claim 5, wherein said current-nonlinear resistance comprises a transistor having an exponential characteristic.

7. An amplifier circuit according to claim 5, wherein said current-nonlinear resistance comprises a MOS field effect transistor of the enhancement type having a drain and a gate, said drain and said gate being interconnected.

8. An amplifier circuit according to claim 4, wherein said first electrical elements comprise a current-nonlinear resistance.

9. An amplifier circuit according to claim 8, wherein said current-nonlinear resistance is a varistor.

10. An amplifier circuit according to claim 8, wherein said current-nonlinear resistance comprises a MOS field effect transistor of the p-channel enhancement type, and a MOS field effect transistor of the n-channel enhancement type, the gates and drains of said transistors being interconnected in pairs.

* * * * *